United States Patent [19]

Boah et al.

[11] 4,104,786
[45] Aug. 8, 1978

[54] METHOD OF MANUFACTURE OF A SEMICONDUCTOR DEVICE

[75] Inventors: John K. Boah, Port Byron; Richard W. Kennedy, Skaneateles, both of N.Y.

[73] Assignee: General Electric Company, Auburn, N.Y.

[21] Appl. No.: 767,946

[22] Filed: Feb. 11, 1977

Related U.S. Application Data

[62] Division of Ser. No. 635,747, Nov. 26, 1975, Pat. No. 4,063,272.

[51] Int. Cl.² .............................................. B01J 17/00
[52] U.S. Cl. ........................................ 29/583; 29/588
[58] Field of Search ................. 29/580, 583, 588, 590; 357/48, 50, 55

[56]  References Cited
U.S. PATENT DOCUMENTS

| | | | |
|---|---|---|---|
| 3,535,774 | 10/1970 | Baker | 29/580 |
| 3,896,477 | 7/1975 | Itutson | 357/55 X |
| 3,908,187 | 9/1975 | Sheldon et al. | 357/55 X |
| 3,911,471 | 10/1975 | Kooi | 357/50 |
| 3,972,113 | 8/1976 | Nakata et al. | 29/580 |
| 3,979,230 | 9/1976 | Anthony et al. | 357/48 X |
| 3,982,269 | 9/1976 | Torreno et al. | 357/48 X |
| 4,010,534 | 3/1977 | Anthony et al. | 29/580 X |

*Primary Examiner*—Howard N. Goldberg
*Attorney, Agent, or Firm*—R. J. Mooney; S. B. Salai

[57]  ABSTRACT

Disclosed is a semiconductor device and a method for the manufacture thereof. A semiconductor wafer with three stacked regions is provided. An inner region exhibits one conductivity type and the two outer regions exhibit the opposite conductivity type. Isolation regions of the opposite conductivity type are formed by the temperature gradient zone melting process to separate the wafer into a plurality of device regions. Peripheral grooves are cut in one major surface in each device region. The grooves extend into the interior region thus electrically isolating the portion of the major surface within the grooves from the other major surface. The grooves are filled with a passivation material.

11 Claims, 14 Drawing Figures

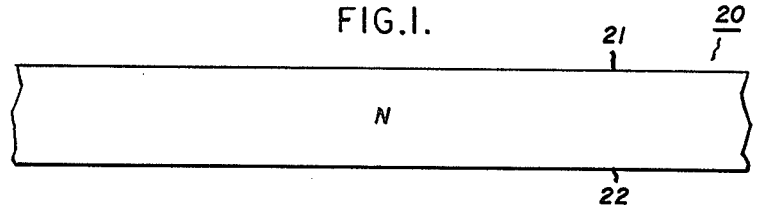
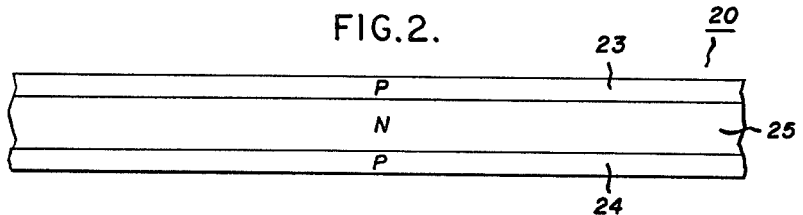
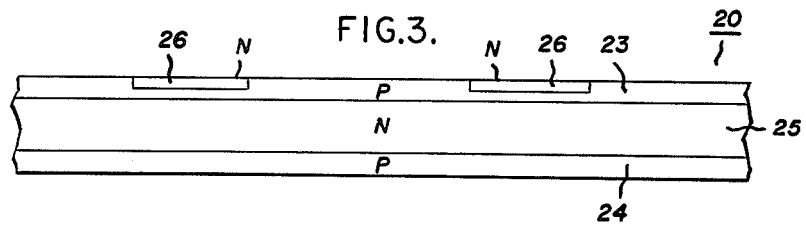
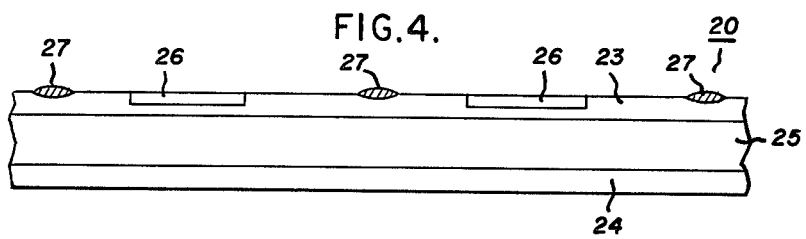
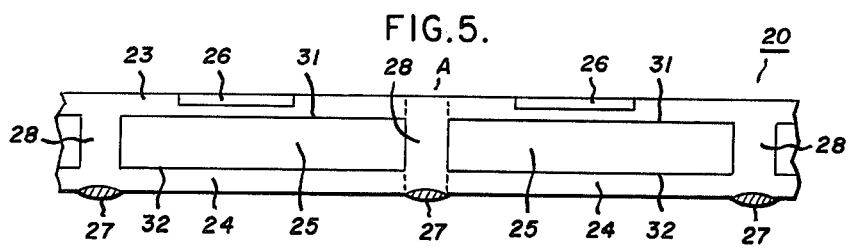
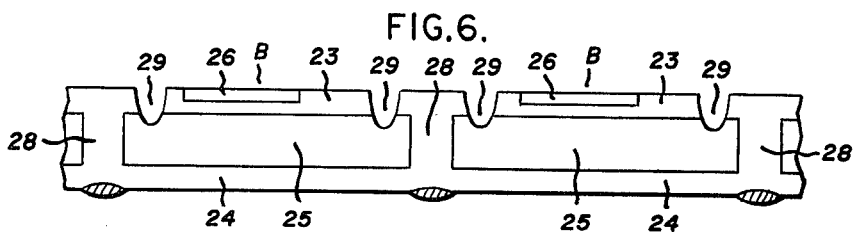
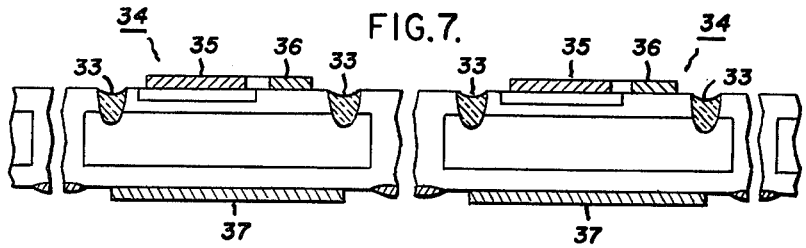

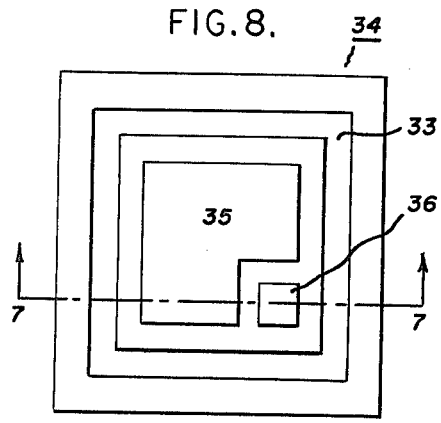
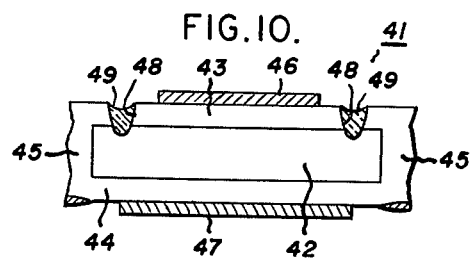
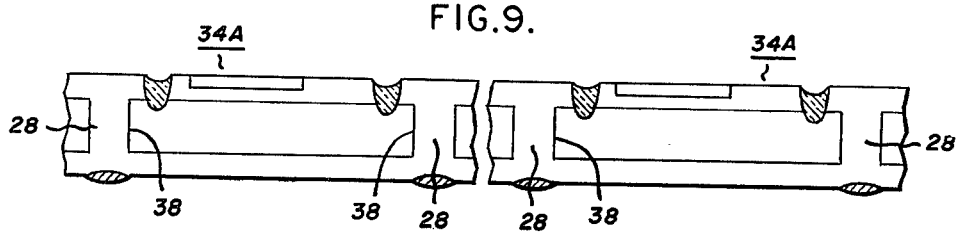
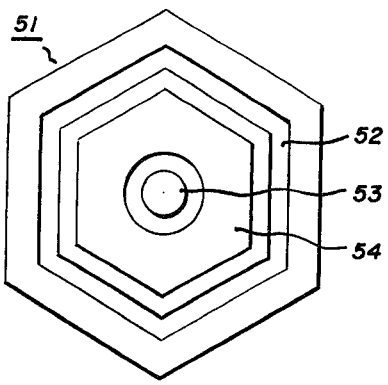
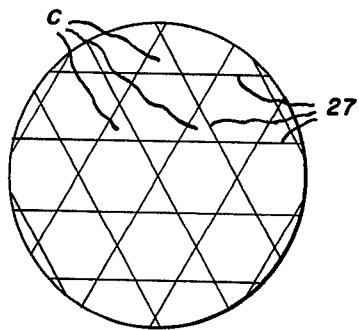
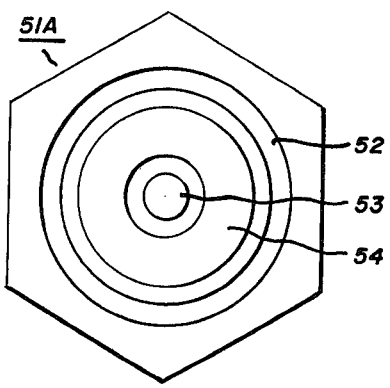
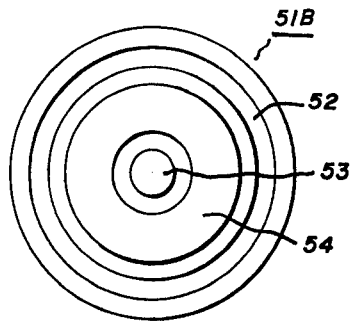

METHOD OF MANUFACTURE OF A SEMICONDUCTOR DEVICE

This is a division of application Ser. No. 635,747, filed Nov. 26, 1975, now U.S. Pat. No. 4,063,272, Dec. 13, 1977, entitled, "Semi-conductor Device and Method of Manufacture Thereof."

BACKGROUND OF THE INVENTION

This invention relates to the manufacture of semiconductor devices and more particularly to a semiconductor device geometry primarily useful for power semiconductor devices and to a method of manufacturing devices of that geometry, the method incorporating temperature gradient zone melting techniques.

All but the largest semiconductor devices are normally manufactured from wafers of semiconductor material of sufficient size to form several devices. Thus, a plurality of devices is processed simultaneously in wafer form. Following the formation of the devices in wafer form, the wafer is subdivided to form individual device pellets which are then packaged as desired. All of the above is well known in the prior art.

Many power semiconductors are now passivated, usually with glass. When a plurality of semiconductor devices is made in wafer form, glassivation is usually begun by grooving each face of the wafer to expose the voltage blocking junctions. The grooves on each side of the wafer are generally in registration. (See, for example, U.S. Pat. No. 3,644,801 issued to Gary S. Sheldon on February 22, 1972, and assigned to the assignee of the present invention.) Glass is deposited in the grooves and then the wafer is subdivided and packaged by conventional techniques.

A problem that occurs when manufacturing glass passivated devices in the aforementioned manner is that the registered grooves sometimes weaken the semiconductor wafer to the point that wafer breakage during subsequent processing steps reaches an unacceptably high level. This problem can, of course, be alleviated by foregoing glass passivation. However, for many demanding applications, the superior electrical properties and reliability of glass or high quality passivation are extremely important.

It is, therefore, an object of this invention to provide a semiconductor device with superior properties, and, to provide a method for manufacturing the device which alleviates the problem of wafer breakage.

SUMMARY OF THE INVENTION

This invention is characterized by a semiconductor device and by a method for the manufacture thereof. A wafer of semiconductor material which contains an impurity imparting a first conductivity type is provided. A second type of impurity which imparts the opposite conductivity type is diffused into the wafer from each of the major surfaces thus providing a wafer with three stacked layers. Next, a plurality of elongated bodies of the second type of impurity is thermally migrated through the wafer in a two dimensional array from one major surface to the other to divide the wafer into a plurality of device regions. Following the thermomigration, each device region consists of an interior region of the one conductivity type completely surrounded by semiconductor material of the opposite conductivity type. Next, a peripheral groove is formed in each device region extending from one major surface into the interior region, thus electrically isolating the portion of the outer region contained within the groove from the outer region adjacent the other major face. It will be appreciated that a peripheral groove intersects both blocking junctions of each device region. Next, the grooves are passivated. Preferably, glass is used. However, the invention is not limited to glass; other passivants may be used. For example, oxide or some of the newer organic passivating compounds may be employed. Finally, contacts are applied, the wafer is subdivided, and the pellets are packaged in a conventional manner.

The isolation regions of the present invention permit access to both main blocking junctions from either side of the wafer and thus permit both junctions to be passivated with a single groove cut from either side of the wafer. Thus, double grooving and the resultant wafer weakness is avoided.

Utilization of temperature gradient zone melting for the isolation region formation is advantageous inasmuch as it permits the isolation regions to be formed in approximately 5 to 10 minutes. The regions can be formed before or after the device diffusion process have been completed. Thus, as will become even more apparent below, the temperature gradient zone melting is practiced at a temperature which is low enough and for a time short enough that the diffusion profiles are not significantly affected.

The device manufactured as described above is a diac. If an electrical contact is made to the interior region, a transistor will be formed. Or, as is described in more detail below, a cathode emitter region can be formed adjacent a portion of one of the major surfaces thus providing an SCR. Many other variations of the device and process will readily suggest themselves to those skilled in the art.

DESCRIPTION OF THE DRAWINGS

These and other features and objects of the present invention will become more apparent upon a perusal of the following description taken in conjunction with the accompanying drawings wherein:

FIG. 1 is a sectional elevation view of a semiconductor wafer;

FIG. 2 is a sectional elevation view of the wafer of FIG. 1 following initial diffusion in accordance with the subject invention;

FIG. 3 is an elevation view of the wafer of FIGS. 1 and 2 following yet another diffusion step;

FIG. 4 is an elevation view of the wafer of FIG. 3 as it is prepared for the thermomigration step;

FIG. 5 is an elevation view of the wafer of FIG. 4 following thermomigration;

FIG. 6 is an elevation view of the wafer following the formation of the peripheral grooves;

FIG. 7 a section through line 7—7 of FIG. 8 illustrates finished SCR device pellets fabricated in accordance with the teachings herein;

FIG. 8 is a plan view of a completed SCR pellet fabricated in accordance with the teachings herein;

FIG. 9 is a sectional elevation view of two SCR pellets illustrating a modification of the subject invention;

FIG. 10 is an elevation view of a diac pellet manufactured in accordance with the teachings herein;

FIG. 11 is a view of an SCR pellet with a hexagonal configuration;

FIG. 12 is a plan view of a semiconductor wafer illustrating the thermomigration and scribe pattern utilized to form the pellet of FIG. 11;

FIG. 13 is a plan view of an SCR pellet similar to that shown in FIG. 11 but with a circular rather than a hexagonal peripheral groove; and FIG. 14 is a plan view of a circular SCR pellet fabricated in accordance with the teachings herein.

DESCRIPTION OF THE PREFERRED METHOD AND EMBODIMENTS

Referring first to FIG. 1, there is shown a wafer 20 of semiconductor material which defines two major surfaces 21 and 22. The wafer may be any convenient size such as is normally used in the semiconductor processing art. For example, it may be approximately 16 mils in thickness and two inches in diameter. Only a portion of the wafer 20 is shown in order to preserve clarity in the Figures.

The wafer 20 contains a first type of impurity that imparts to the wafer one conductivity type. For purposes of illustration, it will subsequently be assumed that the wafer 20 consists of silicon and that the one conductivity type is N-type. Thus, the first type of impurity is an impurity that imparts N-type conductivity, such as arsenic or phosphorus.

Referring now to FIG. 2, there is shown an elevation view of the wafer 20 following a subsequent processing step. A second type of impurity which imparts to the wafer the opposite, or P, conductivity type is diffused in from each major surface. The second type of impurity can be, for example, gallium or boron. Thus, the wafer 20 has three stacked layers or regions, two outer P-type regions 23 and 24, and an interior N-type region 25. In the example being pursued, that is utilizing a 16 mil thick wafer, the regions 23 and 24 are each preferably about 3 mils in thickness. A 3-mil depth will be reached following a diffusion time of about 45 hours at 1250° C. Such diffusion cycles are well known in the prior art.

Referring now to FIG. 3, there is shown the wafer of FIG. 2 with spaced cathode emitter regions 26 diffused part way through the region 23. The cathode emitter regions are N-type and can be formed by the diffusion of a first type of impurity at 1250° C for approximately 10 to 15 hours. Again, such diffusion cycles are well known in the prior art as are the preceding photoresist masking steps. The cathode emitter regions could also be formed by other conventional techniques, such as alloying.

Referring now to FIG. 4, there is shown the wafer 20 of FIG. 3 prepared for the temperature gradient zone melting, or thermomigration, step. Elongated bodies 27 of a second type of impurity, such as aluminum, are disposed on the major surface 21. The elongated bodies run perpendicularly to the paper and thus their size is not fully appreciated solely from FIG. 4. The elongated bodies are shown partially intruding into the region 23 because the aluminum 27 must be in intimate contact with the silicon. Thus, it is helpful to slightly groove the surface of the silicon where the aluminum is to be placed. Alternatively, the aluminum can be alloyed or thermocompression bonded in place. Such methods of intimately associating the aluminum and the silicon are known in the prior art. See, for example, U.S. Pat. Nos. 3,895,967 issued to T. R. Anthony, et al.; 3,901,736 issued to T. R. Anthony, et al.; and 3,897,277 issued to S. M. Blumenfeld; all assigned to the present assignee. Or, the impurity can be located by an oxide mask.

Referring now to FIG. 5, there is shown the wafer 20 of FIG. 4 following the thermomigration step. The elongated bodies of material 27 have migrated through the wafer from the major surface 21 to the major surface 22 leaving in their path isolation regions 28 of the opposite, P, conductivity type. The isolation regions are regions of silicon uniformly doped to the solid solubility limit of aluminum in silicon at the temperature of migration. The heavily doped isolation regions really extend completely from one major surface to the other as shown by the combination of solid and broken lines at A for the center region. However, the boundary of the isolation region indicated by the broken line has been omitted from the other regions in FIG. 5 and from subsequent drawings inasmuch as the regions 23 and 24 are P-type regions and thus no P/N junction exists between them and the regions 28.

Essentially, the temperature gradient zone melting process is carried on by exposing the wafer 20 to a temperature gradient while the entire wafer is maintained at an elevated temperature. Typically, if the temperature of the wafer is in excess of about 800° or 900° C, a temperature gradient of a few degrees to a few hundred degrees will cause the aluminum to migrate through the wafer, from cold to hot, leaving in its trail a recrystallized region doped to the solid solubility limit of aluminum in silicon at the migration temperature. We prefer to thermomigrate at about 1200° C with a temperature gradient of about 5° across the wafer. This requires 5 to 10 minutes.

For further background information relating to the temperature gradient zone melting process, reference is made to U.S. Pat. No. 3,899,362 issued to H. E. Cline et al., and the U.S. patent application, Ser. No. 578,807, filed May 19, 1975, now U.S. Pat. No. 4,001,047 in the name of John K. Boah, and entitled, "Temperature Gradient Zone Melting Utilizing Infrared Radiation," both assigned to the present assignee.

FIG. 5 shows two device regions separated by the central isolation region 28 at A. Each device region consists of an interior region 25 of N-type conductivity completely surrounded by semiconductor material of P-type conductivity. It will be appreciated by those skilled in the art that the entire wafer 20 will usually contain many separate device regions. Furthermore, it will be appreciated by those skilled in the semiconductor art that the isolation regions 28 are formed in a grid pattern and really extend around the entire periphery of the device region. This is shown clearly in the subsequent plan views.

Referring now to FIG. 6, there is shown an elevation view of the wafer 20 with peripheral grooves 29 formed in the outer region 23 and extending into the interior region 25. The grooves 29 are formed by conventional photolithographic masking and etching techniques and extend along each of the isolation regions as illustrated in FIG. 8. In addition to the conventional masking and etching processes, it may be helpful to lightly etch the surface 21 near the isolation regions 28 following migration to smooth the surface. This process is fully described in a copending patent application filed concurrently herewith by M. F. Chang and entitled, "Post Temperature Gradient Zone Melting Surface Etch," now U.S. Pat. No. 4,042,448.

An examination of FIG. 6 reveals that the portions B of the region 23 within the peripheral groove 29 are electrically isolated from the region 24 due to the back-to-back P/N junctions 31 and 32. Thus, when the grooves are filled with a passivating material 33 as shown best in FIG. 7, the two semiconductor junctions 31 and 32 are completely passivated with a single groove and application of passivant material 33. The passivant material 33 can be glass applied in a known manner. However, it should be appreciated that other passivating material can be used. For example, oxide or one of the new organic passivant materials can be advantageously employed.

When wafer 20 is subdivided through the isolation regions 28 as shown in FIG. 7, individual semiconductor device pellets 34 are formed. Those skilled in the art will recognize the pellets 34 as SCR pellets. Finally, metal contacts 35, 36, and 37 are added in a conventional manner. A plan view of a pellet 34 is shown in FIG. 8.

A modification of the semiconductor device pellet 34 is shown in FIG. 9 and is denoted 34A. The difference between the devices 34 and 34A is that during the formation of the pellets 34A, an array of pairs of closely spaced, parallel, elongated bodies 27 of dopant material are deposited on the wafer. Thus, following thermomigration, there are two closely spaced isolation regions 38 in the area that will be broken during subdivision. This can be thought of as a composite isolation region. Thus, subdivision takes place between the two closely spaced isolation regions 28. The embodiment 34A is advantageous inasmuch as the scribing and breaking operations do not have to be as precisely carried out since the break line is substantially spaced from the P-N junction 38. However, the embodiment 34A may be less economical than the embodiment 34 inasmuch as a greater wafer area is required for the two isolation regions. Thus, a certain amount of silicon is lost. It must be understood that a two-dimensional pattern of closely spaced, parallel bodies 27 is used so that the device regions are completely isolated.

Referring now to FIG. 10, there is a sectional elevation view of a semiconductor device pellet 41 including an interior region 42 of a first conductivity type and outer regions 43 and 44 of the opposite conductivity type. Also, isolation regions 45 of the opposite conductivity type are included. Two metallic contacts 46 and 47 and a peripheral groove 48 containing a passivant material 49 complete the device. The pellet 41 will be recognized by those skilled in the art as a diac. It is formed just as the SCR pellet 34 was formed except that the cathode emitter is omitted. Thus, some of the many variations possible with the process will come to mind. For example, if contact is made to the interior region 42, the pellet 41 will be a transistor.

Referring now to FIG. 11, there is shown a semiconductor device pellet 51 which is of a hexagonal configuration. The pellet 51 is an SCR and is formed as was the pellet 34 except that three groups of generally parallel elongated bodies 27 of impurity were employed in a hexagonal configuration as illustrated in FIG. 12. Also, the peripheral, passivated groove 52 is hexagonal. The pellet 51 is shown as a center gate SCR with a circular gate contact 53 and a hexagonal emitter contact 34.

Preferably, the peripheral edge of the pellet 51 coincides with the natural cleavage planes of the crystal of semiconductor material to simplify subdivision. It is realized that the packing arrangement shown in FIG. 12 is not the closest hexagonal packing available, and that the regions labeled "C" will be wasted. However, the packing arrangement shown permits linear bodies of dopant 27 to be utilized and permits straight line scribing and breaking during the subdivision process.

The advantage of a hexagonal pellet is that it packs in a circular housing with greater volumetric efficiency than a square pellet yet is easier to scribe and break than a circular wafer.

Referring now to FIG. 13, there is shown a modification 51A of the pellet 51 wherein the peripheral passivated groove 52 forms a circle and the emitter contact 54 is circular. It will be appreciated that since the groove 52 and the contacts 53 and 54 are formed and located by conventional techniques, such as photolithography, any desired shape can be utilized.

Referring now to FIG. 14, there is shown a pellet 51B similar to the pellet 51A except that the shape of the pellet is a circle. Such circular pellets are known and are formed, for example, by such techniques as sandblasting. The contacts 53 and 54 and the groove 52 are also circular.

It should be appreciated that the pellets 51, 51A, and 51B can be formed with the scribe path going through the isolation region as was the pellet 34, or can be formed with two spaced isolation regions and a scribe path passing therebetween as depicted with respect to the pellet 34A in FIG. 9.

It has been found helpful to perform a short diffusion cycle following the migration step. During the diffusion cycle, most breaks in the isolation region will be closed and thus device yields will be improved. The post diffusion cycle is fully described in patent application field concurrently herewith by Anthony, et al., and entitled, "Post Diffusion After Temperature Gradient Zone Melting," now U.S. Pat. No. 4,021,269.

In view of the foregoing, many modifications and variations of the subject invention will be apparent to those skilled in the art. For example, the order of the steps of processing can be changed. Specifically, thermomigration can precede the diffusion steps. It is to be understood therefore that the scope of this invention is only as limited by the following Claims.

What is claimed is:

1. A method of making semiconductor devices comprising the steps of:
    providing a wafer of semiconductor material, said wafer containing a first type of impurity for imparting one conductivity type thereto;
    thermomigrating through said wafer a plurality of elongated bodies of a material which is an impurity of a second type which imparts the opposite conductivity type to said semiconductor material, said thermomigrating step forming a plurality of isolation regions that separate a plurality of device regions of said given conductivity type in said wafer;
    diffusing an impurity of the second type into each major surface of said wafer so that each of said device regions comprises an interior region of said one conductivity type surrounded by semiconductor material of said opposite type;
    forming a peripheral groove in each of said device regions in one of said major surfaces, said groove extending into the associated interior region such that the area of said one major surface within said groove is electrically isolated from the other major surface;
    passivating said groove; and
    subdividing said wafer into semiconductor device pellets through said isolation regions, each containing one of said device regions.

2. A method according to claim 1 comprising the additional step of forming a cathode emitter of said given conductivity type adjacent part of said one major surface of each of said device regions, said additional step being carried out prior to said step of forming grooves.

3. A method according to claim 1 wherein said elongated bodies are linear and comprise three groups, each group comprising a plurality of substantially parallel bodies, and wherein said bodies are arranged so that said device regions are hexagonal in shape.

4. A method according to claim 3 wherein said semiconductor device pellets are hexagonal.

5. A method according to claim 4 wherein said wafer is subdivided along its natural cleavage planes.

6. A method according to claim 5 comprising the additional step of forming a cathode emitter of said given conductivity type adjacent part of said one major surface of each of said device regions, said additional step being carried out prior to said step of forming grooves.

7. A method according to claim 1 wherein each of said isolation regions is formed by migrating two closely spaced elongated bodies such that each isolation region is a composite isolation region comprising two regions of said opposite conductivity type separated by a thin region of said one conductivity type and the subdivision is through said thin region.

8. A method according to claim 1 wherein said elongated bodies are circular.

9. A method according to claim 1 wherein said wafer is N-type silicon.

10. A method according to claim 1 wherein said impurity of a second type is aluminum.

11. A method according to Claim 1 wherein said step of passivating said groove comprises applying glass.

* * * * *